United States Patent
Zhou (10) Patent No.: US 9,588,389 B2
(45) Date of Patent: Mar. 7, 2017

(54) ARRAY SUBSTRATE AND METHOD FOR MANUFACTURING THE SAME, AND DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventor: Jideng Zhou, Beijing (CN)

(73) Assignees: BOE TECHNOLOGY GROUP CO., LTD. (CN); HEFEI BOE OPTOELECTRONICS TECHNOLOGY CO., LTD. (CN)

( * ) Notice: Subject to any disclaimer, the term of this patent is extended or adjusted under 35 U.S.C. 154(b) by 303 days.

(21) Appl. No.: 14/381,626

(22) PCT Filed: Dec. 13, 2013

(86) PCT No.: PCT/CN2013/089431
§ 371 (c)(1),
(2) Date: Aug. 28, 2014

(87) PCT Pub. No.: WO2015/027620
PCT Pub. Date: Mar. 5, 2015

(65) Prior Publication Data
US 2016/0313621 A1    Oct. 27, 2016

(30) Foreign Application Priority Data
Aug. 30, 2013  (CN) .......................... 2013 1 0390431

(51) Int. Cl.
*H01L 27/14*  (2006.01)
*G02F 1/1362*  (2006.01)
(Continued)

(52) U.S. Cl.
CPC ...... *G02F 1/136286* (2013.01); *G02F 1/1368* (2013.01); *G09G 3/3648* (2013.01);
(Continued)

(58) Field of Classification Search
None
See application file for complete search history.

(56) References Cited

U.S. PATENT DOCUMENTS 8,427,620 B2 * 4/2013 Saito ................. G02F 1/134363
349/113
9,419,019 B2 * 8/2016 Cheng ................. H01L 27/1222
(Continued)

FOREIGN PATENT DOCUMENTS

CN    1598652    3/2005
CN    1808710    7/2006
(Continued)

OTHER PUBLICATIONS

First Office Action issued in corresponding Chinese Application No. 2013103904319 dated Jun. 2, 2015.
(Continued)

*Primary Examiner* — Minh-Loan Tran
(74) *Attorney, Agent, or Firm* — Bakerhostetler LLP (57) ABSTRACT

The array substrate according to the present disclosure may include a base substrate, gate lines and data lines arranged in a crisscross manner on the base substrate, and a common electrode; wherein the common electrode includes a transparent conductive layer and a first auxiliary conductive layer under the transparent conductive layer; the first auxiliary conductive layer of the common electrode at least partially overlaps the gate lines or the data lines.

17 Claims, 4 Drawing Sheets

(51) Int. Cl.
*H01L 27/02* (2006.01)
*G09G 3/36* (2006.01)
*H01L 27/32* (2006.01)
*H01L 27/12* (2006.01)
*G02F 1/1368* (2006.01)

(52) U.S. Cl.
CPC ............ *H01L 27/02* (2013.01); *H01L 27/124* (2013.01); *H01L 27/1214* (2013.01); *H01L 27/1259* (2013.01); *H01L 27/3244* (2013.01); *G02F 2201/121* (2013.01); *G02F 2201/123* (2013.01)

(56) References Cited

U.S. PATENT DOCUMENTS

| | | | |
|---|---|---|---|
| 2001/0043304 A1 | 11/2001 | Matsumoto | |
| 2010/0123868 A1 | 5/2010 | Kim | |
| 2012/0104404 A1* | 5/2012 | Kwack | H01L 27/1288 257/72 |
| 2013/0234143 A1* | 9/2013 | Hwang | G02F 1/1362 257/57 |

FOREIGN PATENT DOCUMENTS

| | | |
|---|---|---|
| CN | 101806982 | 8/2010 |
| CN | 103018977 | 4/2013 |
| JP | 3099816 | 8/2000 |
| KR | 20080003081 | 1/2008 |

OTHER PUBLICATIONS

International Search Report and Written Opinion issued in corresponding International Application No. PCT/CN2013/089431 dated Jun. 10, 2014.

Office Action in Chinese Patent Application No. 201310390431.9, dated Nov. 16, 2015.

Office Action in Chinese Patent Application No. 201310390431.9, dated Apr. 28, 2016.

* cited by examiner

ARRAY SUBSTRATE AND METHOD FOR MANUFACTURING THE SAME, AND DISPLAY DEVICE

CROSS-REFERENCE TO RELATED APPLICATION

This application is the U.S. national phase of PCT Application No. PCT/CN2013/089431 filed on Dec. 13, 2013, which claims priority to Chinese Patent Application No. 201310390431.9 filed on Aug. 30, 2013, the disclosures of which are incorporated in their entirety by reference herein.

TECHNICAL FIELD

The present disclosure relates to the field of display technologies, and more particularly to an array substrate and a method for manufacturing the same, a display device and an electronic product.

BACKGROUND

Advanced Super Dimension Switch Thin Film Transistor Liquid Crystal Display (abbreviated as ADS TFT-LCD) uses an electric field generated by edges of slit electrodes on a same plane and an electric field generated between the slit electrodes and plate electrodes to form a multidimensional electric field, so that liquid crystal molecules between and above the slit electrodes in a display panel can rotate, and an operating efficiency of the liquid crystal is increased and the light transmission efficiency is also increased. The display effect is mainly determined by the display panel. The display panel includes an array substrate, a color filter substrate and a liquid crystal molecule layer between the two substrates.

Greenish phenomenon of a display picture or other undesirable phenomena usually occurs on the display panel of the ADS TFT-LCD. A main reason why the greenish phenomenon occurs on the display picture is that a voltage of a common electrode disposed on the array substrate is distorted, i.e., a waveform of the voltage of the common electrode is deviated, or the voltage of the common electrode is attenuated, i.e., a value of the voltage of the common electrode is reduced as a transmission distance increases. Thus, the occurrence of the greenish phenomenon of the display picture and other undesirable phenomena can be avoided through preventing an occurrence of distortion attenuation of the voltage of the common electrode.

SUMMARY

One technical problem to be solved by embodiments of the present disclosure is to provide an array substrate and a method for manufacturing the same, a display device and an electronic product, which can improve greenish phenomenon of a display picture of a display panel of an ADS TFT-LCD and can be implemented easily.

In order to solve the above technical problem, a first aspect of one embodiment of the present disclosure provides an array substrate adopting following technical solutions:

An array substrate may include a base substrate, gate lines and data lines arranged in a crisscross manner on the base substrate, and a common electrode; wherein the common electrode includes a transparent conductive layer and a first auxiliary conductive layer under the transparent conductive layer; the first auxiliary conductive layer of the common electrode at least partially overlaps the gate lines or the data lines.

The array substrate may further include thin film transistors and pixel electrodes; wherein the common electrode further includes a second auxiliary conductive layer between a periphery of the thin film transistors and a periphery of the pixel electrodes; the second auxiliary conductive layer and the first auxiliary conductive layer are integrally formed; the transparent conductive layer is located on the second auxiliary conductive layer.

The first auxiliary conductive layer and the second auxiliary conductive layer may be made of metal; optionally, the metal may be copper, aluminum, silver, molybdenum, chromium, or any combination thereof.

The first auxiliary conductive layer may completely cover the gate lines or the data lines.

The first auxiliary conductive layer may be located directly above the gate lines or the data lines; and an area of an orthographic projection of the first auxiliary conductive layer on the base substrate may be smaller than an area of an orthographic projection of the gate lines or the data lines on the base substrate.

The first auxiliary conductive layer may cover a part of the gate lines or the data lines.

A thickness of each of the first auxiliary conductive layer and the second auxiliary conductive layer may be 900~1500 Å; and a thickness of the transparent conductive layer may be 400~700 Å.

The array substrate described above may include a base substrate, gate lines and data lines arranged in a crisscross manner on the base substrate, and a common electrode; wherein the common electrode includes a transparent conductive layer and a first auxiliary conductive layer under the transparent conductive layer; the first auxiliary conductive layer of the common electrode at least partially overlaps the gate lines or the data lines. The common electrode disposed on the array substrate having structures described above may include the first auxiliary conductive layer and the transparent conductive layer, and the first auxiliary conductive layer and the transparent conductive layer may be connected in parallel so as to together form the common electrode. Thus the common electrode has a smaller resistance, which can reduce distortion attenuation of a voltage of the common electrode so that a waveform of the voltage of the common electrode is not easily deviated and a value of the voltage of the common electrode is not significantly reduced as a transmission distance increases, thereby improving greenish phenomenon of a display picture and improving display effect of an ADS TFT-LCD.

A second aspect of one embodiment of the present disclosure provides a display device including the above array substrate.

In order to further solve the above technical problem, a third aspect of one embodiment of the present disclosure further provides a method for manufacturing array substrates which includes:

sequentially forming a pattern including gate lines and a pattern including data lines on a base substrate, the gate lines being crisscrossed with the data lines;

forming a pattern including a first auxiliary conductive layer on the formed pattern of the data lines, the first auxiliary conductive layer at least partially overlapping the gate lines or the data lines; and forming a pattern including a transparent conductive layer on the formed pattern of the first auxiliary conductive layer.

The method may further include forming a second auxiliary conductive layer at the time of forming the pattern including the first auxiliary conductive layer on the formed pattern of the data line lines; wherein the first auxiliary conductive layer and the second auxiliary conductive layer are integrally formed; the second auxiliary conductive layer is located between a periphery of thin film transistors on the array substrate and a periphery of pixel electrodes;

the forming a pattern including a transparent conductive layer on the formed pattern of the first auxiliary conductive layer may include:

forming the pattern including the transparent conductive layer on the formed patterns of the first auxiliary conductive layer and the second auxiliary conductive layer.

The first auxiliary conductive layer and the second auxiliary conductive layer may be made of metal; optionally, the metal may be copper, aluminum, silver, molybdenum, chromium, or any combination thereof.

A thickness of each of the first auxiliary conductive layer and the second auxiliary conductive layer may be 900~4500 Å; and a thickness of the transparent conductive layer may be 400~700 Å.

The forming a pattern including a first auxiliary conductive layer on the formed pattern of the data lines, the first auxiliary conductive layer at least partially overlapping the gate lines or the data lines may include:

forming the first auxiliary conductive layer which completely covers the gate lines or the data lines; or forming the first auxiliary conductive layer which is located directly above the gate lines or the data lines; wherein an area of an orthographic projection of the first auxiliary conductive layer on the base substrate is smaller than an area of an orthographic projection of the gate lines or the data lines on the base substrate; or forming the first auxiliary conductive layer which covers a part of the gate lines or the data lines.

It can be seen from the foregoing that the array substrate may include a base substrate, gate lines and data lines arranged in a crisscross manner on the base substrate, and a common electrode; wherein the common electrode includes a transparent conductive layer and a first auxiliary conductive layer under the transparent conductive layer; the first auxiliary conductive layer of the common electrode at least partially overlaps the gate lines or the data lines. The common electrode disposed on the array substrate having structures described above may include the first auxiliary conductive layer and the transparent conductive layer, and the first auxiliary conductive layer and the transparent conductive layer may be connected in parallel so as to together form the common electrode. Thus the common electrode has a smaller resistance, which can reduce distortion attenuation of a voltage of the common electrode so that a waveform of the voltage of the common electrode is not easily deviated and a value of the voltage of the common electrode is not significantly reduced as a transmission distance increases, thereby improving greenish phenomenon of a display picture and improving display effect of an ADS TFT-LCD.

BRIEF DESCRIPTION OF THE DRAWINGS

In order to illustrate technical solutions according to embodiments of the present disclosure or in the prior art more clearly, drawings to be used in the description of the prior art or the embodiments will be described briefly hereinafter. Apparently, the drawings described hereinafter are only some embodiments of the present disclosure, and other drawings may be obtained by those skilled in the art according to those drawings without creative work.

| Numerals in the accompanying drawings mean that: | | |
|---|---|---|
| 1-base substrate; | 2-gate line; | 21-gate electrode; |
| 3-gate insulating layer; | 4-active layer; | 5-data line; |
| 51-source electrode; | 52-drain electrode; | 6-pixel electrode; |
| 7-passivation layer; | 8-common electrode; | |
| 81-first auxiliary conductive layer; | | |
| 82-transparent conductive layer; | | |
| 83-second auxiliary conductive layer. | | |

DETAILED DESCRIPTION

Specific implementation modalities of the present disclosure will be further described hereinafter in conjunction with the drawings and embodiments. The following embodiments are merely used to illustrate the present invention, but shall not be used to limit the scope of the present disclosure.

To make the objects, the technical solutions and the advantages of embodiments of the present disclosure more apparent, the technical solutions of the embodiments of the present disclosure will be described in detail hereinafter in conjunction with the drawings of the embodiments of the present disclosure. Apparently, the embodiments described hereinafter are only some embodiments of the present disclosure, but not all embodiments. Based on the embodiments described hereinafter, other embodiments obtained by those skilled in the art should fall within the scope of the present disclosure.

Unless otherwise defined, the technical or scientific terms used in the present disclosure shall have the general meanings understandable for those ordinarily skilled in the field of the present disclosure. The wordings such as "first", "second" or similar used in the description and claims of the present disclosure shall not represent any order, number or importance, but are used for distinguishing between similar elements. Similarly, the words such as "one", "a" or the like shall not represent limitation of numbers, but mean existence of at least one. The phrases "joint", "connect" or the like are not limited to physical or mechanical connection, but also include electrical connection, no matter directly or indirectly. The phrases "upper", "lower", "left", "right" and etc. shall be used only to represent relative positions, wherein, when the absolute position of the described object is changed, the relative positions may be changed accordingly.

First Embodiment

Figure 1:
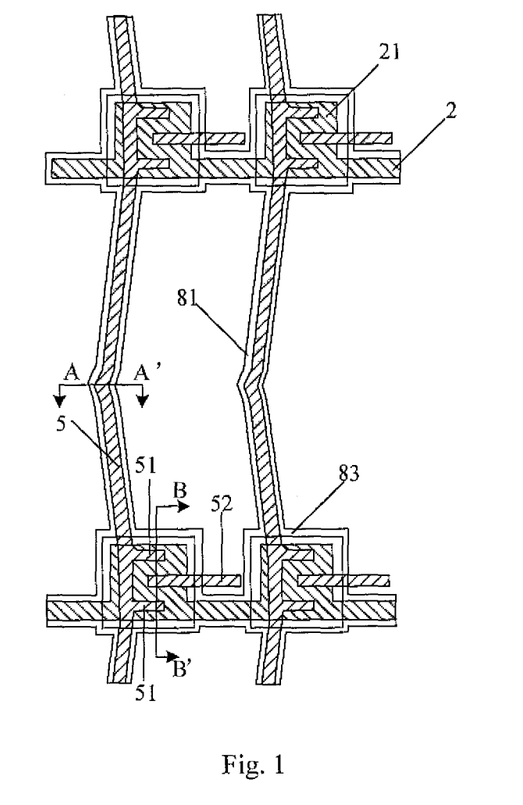
FIG. 1 is a schematic plan view showing a structure of a first array substrate according to one embodiment of the present disclosure.
Figure 2:
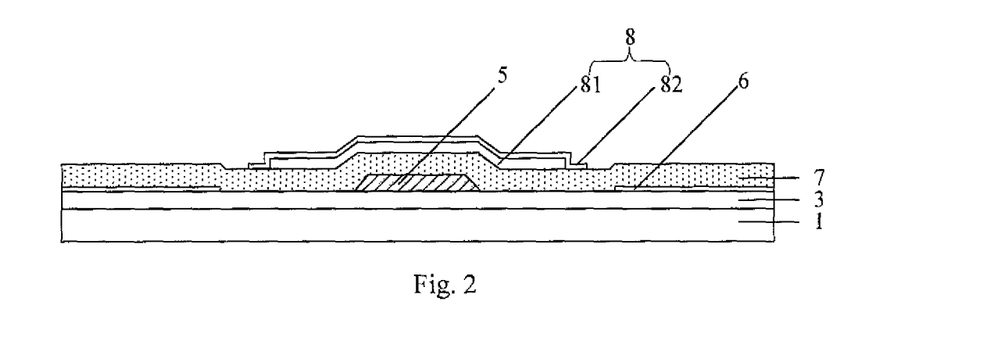
FIG. 2 is a schematic cross-section view of the array substrate taken along a line A-A' as shown in FIG. 1 according to one embodiment of the present disclosure.
Figure 3:
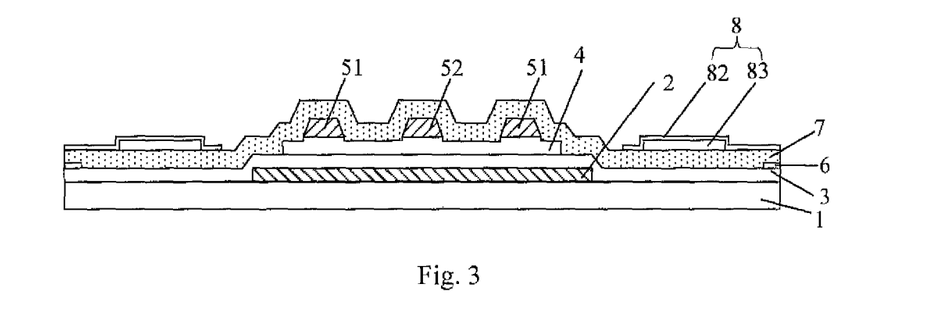
FIG. 3 is a schematic cross-section view of the array substrate taken along a line B-B' as shown in FIG. 1 according to one embodiment of the present disclosure.

One embodiment of the present disclosure provides an array substrate. As shown in FIGS. 1-3, the array substrate includes a base substrate 1, gate lines 2 and data lines 5 arranged in a crisscross manner on the base substrate 1, and a common electrode 8. The common electrode 8 includes a transparent conductive layer 82 and a first auxiliary conductive layer 81 under the transparent conductive layer 82. The first auxiliary conductive layer 81 of the common electrode 8 at least partially overlaps the gate lines 2 or the data lines 5.

The common electrode 8 disposed on the array substrate 1 having structures described above includes the first auxiliary conductive layer 81 and the transparent conductive layer 82, and the first auxiliary conductive layer 81 and the transparent conductive layer 82 are connected in parallel so as to together form the common electrode 8. Thus, the common electrode 8 has a smaller resistance, which can reduce distortion attenuation of a voltage of the common electrode 8 so that a waveform of the voltage of the common electrode 8 is not easily deviated and a value of the voltage of the common electrode 8 is not significantly reduced as a transmission distance increases, thereby improving greenish phenomenon of a display picture and improving display effect of an ADS TFT-LCD.

Further, in order to better reduce the resistance of the common electrode 8, the common electrode 8 may also include a second auxiliary conductive layer 83 located between a periphery of thin film transistors and a periphery of pixel electrodes 6. The second auxiliary conductive layer 83 and the first auxiliary conductive layer 81 are integrally formed. The transparent conductive layer 82 is located on the second auxiliary conductive layer 83.

Specifically, the first auxiliary conductive layer 81 is optionally made of metallic material with good conductivity such as copper, aluminum, silver, molybdenum, chromium, and so on. The transparent conductive layer 82 is optionally made of transparent conductive material such as indium tin oxide, indium zinc oxide, and so on. The second auxiliary conductive layer 83 and the first auxiliary conductive layer 81 are integrally formed, and the second auxiliary conductive layer 83 is also optionally made of metallic material with good conductivity such as copper, aluminum, silver, molybdenum, chromium, and so on.

Currently, the common electrode 8 is usually made of transparent conductive material such as indium tin oxide, indium zinc oxide, and so on, and has good light transmittance. In one embodiment of the present disclosure, the common electrode 8 includes the first auxiliary conductive layer 81, the transparent conductive layer 82 and the second auxiliary conductive layer 83, and the first auxiliary conductive layer 81 and the second auxiliary conductive layer 83 are made of opaque metallic material. Thus, in order to ensure that the disposal of the second auxiliary conductive layer 83 that is opaque on the array substrate does not affect transmittance of a display panel of the ADS TFT-LCD, a width and position of an orthographic projection of the second auxiliary conductive layer 83 on the array substrate should meet that when the array substrate is oppositely arranged with a color filter substrate to form a cell, a black matrix on the color filter substrate can cover the second auxiliary conductive layer 83. Similarly, in order to ensure that the disposal of the first auxiliary conductive layer 81 that is opaque on the array substrate does not affect the transmittance of the display panel of the ADS TFT-LCD, a width and position of an orthographic projection of the first auxiliary conductive layer 81 on the array substrate are also needed to be reasonably set. For example, the width and position of the orthographic projection of the first auxiliary conductive layer 81 on the array substrate can be set by adopting one of following solutions.

First solution: the first auxiliary conductive layer 81 completely covers the data lines 5. As shown in FIGS. 1-3, the first auxiliary conductive layer 81 is located above the data lines 5, and the width of the first auxiliary conductive layer 81 is greater than a width of the data lines 5. Therefore, the resistance of the common electrode 8 can be reduced to the maximum extent. However, the width of the first auxiliary conductive layer 81 is required to be smaller than a width of the black matrix at a corresponding position of the color filter substrate, so as not to affect the transmittance of the display panel of the ADS TFT-LCD. When the first auxiliary conductive layer 81 completely covers the data lines 5, segment difference between the data lines 5 and the pixel electrodes 6 can be effectively reduced, so that the array substrate has a smooth surface so as to be easily coated with an alignment film thereon and not easily form an inadequate friction region. This enables liquid crystal molecules to have a preferred orientation and thus light leakage phenomenon can also be improved to some extent.

Figure 4:
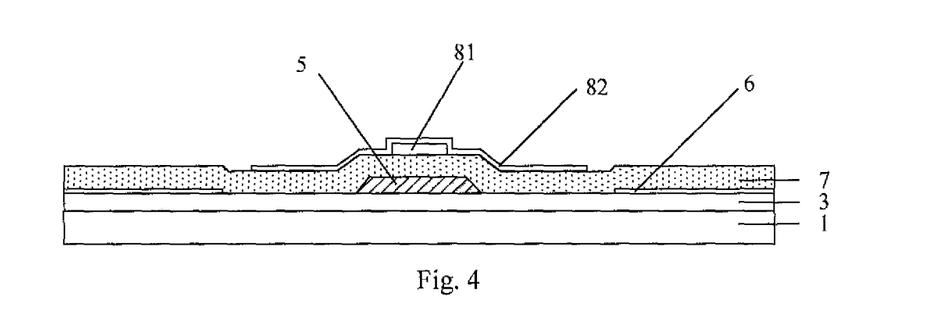
FIG. 4 is a schematic cross-section view of a data line of a second array substrate according to one embodiment of the present disclosure.
Figure 5:
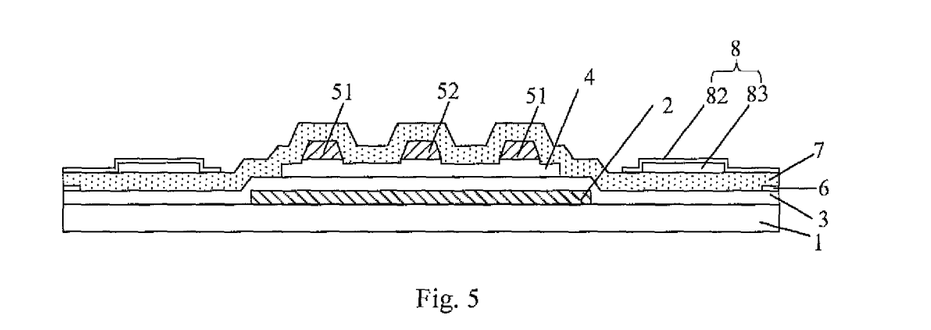
FIG. 5 is a schematic cross-section view of a thin film transistor of the second array substrate according to one embodiment of the present disclosure.

Second solution: the first auxiliary conductive layer 81 is located directly above the data lines 5. As shown in FIGS. 4-5, an area of an orthographic projection of the first auxiliary conductive layer 81 on the base substrate 1 is smaller than an area of an orthographic projection of the data lines 5 on the base substrate 1. The disposal of the first auxiliary conductive layer 81 can slightly reduce the resistance of the common electrode 8, and cannot reduce the segment difference between the data lines 5 and the pixel electrodes 6, but does not affect the transmittance of the display panel of the ADS TFT-LCD.

Figure 6:
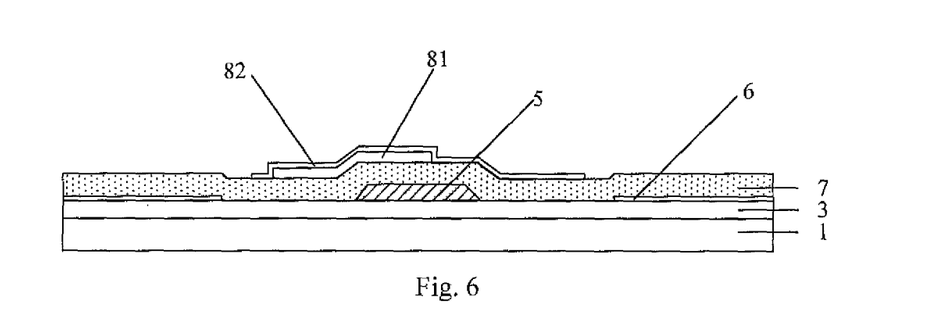
FIG. 6 is a schematic cross-section view of a data line of a third array substrate according to one embodiment of the present disclosure.
Figure 7:
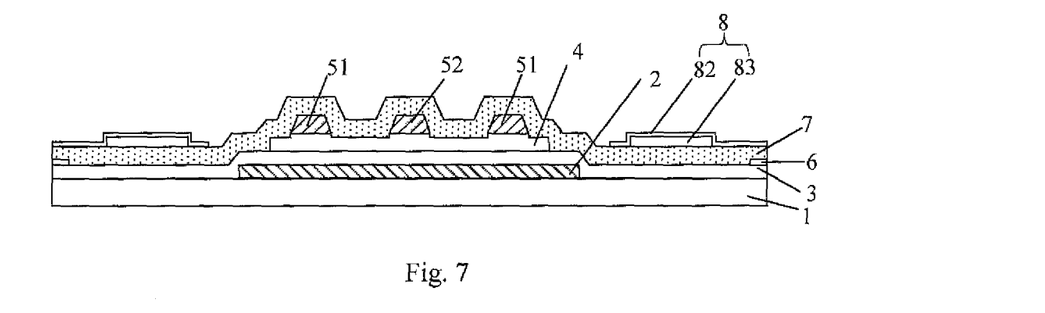
FIG. 7 is a schematic cross-section view of a thin film transistor of the third array substrate according to one embodiment of the present disclosure.

Third solution: the first auxiliary conductive layer 81 covers a part of the data lines 5, as shown in FIGS. 6-7. This design can reduce the resistance of the common electrode 8 to some extent, and can effectively reduce segment difference at one side of the data line 5 covered by the first auxiliary conductive layer 81, thereby playing a role of preventing leakage of light to some extent.

Similarly, the first auxiliary conductive layer 81 can also completely cover the gate lines 2; or the first auxiliary conductive layer 81 is located directly above the gate lines 2, and an area of an orthographic projection of the first auxiliary conductive layer 81 on the base substrate 1 is smaller than an area of an orthographic projection of the gate lines 2 on the base substrate 1; or the first auxiliary conductive layer 81 covers a part of the gate lines 2.

It should be noted that relative positions of the first auxiliary conductive layer 81 and the second auxiliary conductive layer 83 with respect to the gate lines 2 or the data lines 5 are not limited to the above. As long as the disposal of the first auxiliary conductive layer 81 and the second auxiliary conductive layer 83 can reduce the resistance of the common electrode 8 without affecting the transmittance of the display panel of the ADS TFT-LCD, and this is not limited to the embodiments of the present disclosure.

Specifically, the array substrate may further include a base substrate 1. The base substrate 1 is optionally a glass substrate, a quartz substrate, a plastic substrate with good light transmittance, and so on.

As shown in FIGS. 1-3, the gate lines 2 are located on the base substrate 1. The gate line 2 can be a single layer structure or a multiple layer structure. When the gate line 2 is a single layer structure, the gate line 2 can be made of copper, aluminum, silver, molybdenum, chrome, neodymium, nickel, manganese, titanium, tantalum, tungsten or the like, or an alloy formed by any combination of the above elements. When the gate line 2 is a multiple layer structure, the gate line 2 can be copper and titanium, copper and molybdenum, molybdenum and aluminum as well as molybdenum, or the like. The gate line 2 can be directly located on the base substrate 1; alternatively, a buffer layer may also be disposed between the gate lines 2 and the base substrate 1. The buffer layer may be made of silicon nitride or silicon oxide. A thickness of the gate line 2 is optionally 3500~4400 Å.

As shown in FIGS. 1-3, a gate insulating layer 3 is located on the gate lines 2. The gate insulating layer 3 may be made of silicon nitride, silicon oxide, silicon oxynitride, or the like. The gate insulating layer 3 may be a single layer structure, or a double layer structure composed of silicon nitride or silicon oxide. A thickness of the gate insulating layer 3 is optionally 3550~4450 Å.

As shown in FIGS. 1-3, an active layer 4 is located on the gate insulating layer 3. The active layer 4 may be made of polysilicon, amorphous silicon, monocrystalline silicon, oxide semiconductor, or other semiconductor material. The active layer 4 may be a single layer structure, or a multiple layer structure. A thickness of the active layer 4 is optionally 2000~2600 Å.

As shown in FIGS. 1-3, the data lines 5, source electrodes 51 and drain electrodes 52 are located on the active layer 4. The data lines 5, the source electrodes 51 and the drain electrodes 52 each may be a single layer structure, or a multiple layer structure. When the data lines 5, the source electrodes 51 and the drain electrodes 52 have the single layer structure, the data lines 5, the source electrodes 51 and the drain electrodes 52 may be made of copper, aluminum, silver, molybdenum, chrome, neodymium, nickel, manganese, titanium, tantalum, tungsten or the like, or an alloy formed by any combination of the above elements. When the data lines 5, the source electrodes 51 and the drain electrodes 52 have the multiple layer structure, the data lines 5, the source electrodes 51 and the drain electrodes 52 may be made of can be copper and titanium, copper and molybdenum, molybdenum and aluminum as well as molybdenum, or the like.

As shown in FIGS. 1-3, the pixel electrode 6 is electrically connected with the drain electrode 52, and is located on the gate insulating layer 3. The pixel electrode 6 is usually made of transparent conductive material, such as indium tin oxide, indium zinc oxide, and so on. A thickness of the pixel electrode 6 is optionally 400~700 Å.

As shown in FIGS. 1-3, a passivation layer 7 is located on the data lines 5, the source electrodes 51, the drain electrodes 52 and the pixel electrodes 6. The passivation layer 7 may be a single layer of silicon nitride, silicon oxide or silicon oxynitride, and may also be a multiple layer composed of silicon nitride or silicon oxide. Further, the passivation layer 7 may also be made of organic resin, such as acrylic resin, polyimide, polyamide, or the like. A thickness of the passivation layer 7 is optionally 200~5000 Å.

As shown in FIGS. 1-3, the common electrode 8 is located on the passivation layer 7. The common electrode 8 includes a first auxiliary conductive layer 81, a transparent conductive layer 82 and a second auxiliary conductive layer 83. The first auxiliary conductive layer 81 and the second auxiliary conductive layer 83 are optionally made of metallic material with good conductivity, such as copper, aluminum, silver, molybdenum, chromium, and so on. The transparent conductive layer 82 is optionally made of transparent conductive material, such as indium tin oxide, indium zinc oxide, and so on. A thickness of each of the first auxiliary conductive layer 81 and the second auxiliary conductive layer 83 is optionally 900~1500 Å. Besides, a thickness of the transparent conductive layer 82 is optionally 400~700 Å.

In addition, one embodiment of the present disclosure further provides a display device which includes the above array substrate. The display device can be applied in following electronic products, including but not limited to: a liquid crystal panel, an E-paper, an organic light-emitting diode (OLED) panel, a mobile phone, a tablet PC, a television, a monitor, a notebook computer, a digital photo frame, a navigator, or any other electronic products or components having display function.

Second Embodiment

Figure 8:
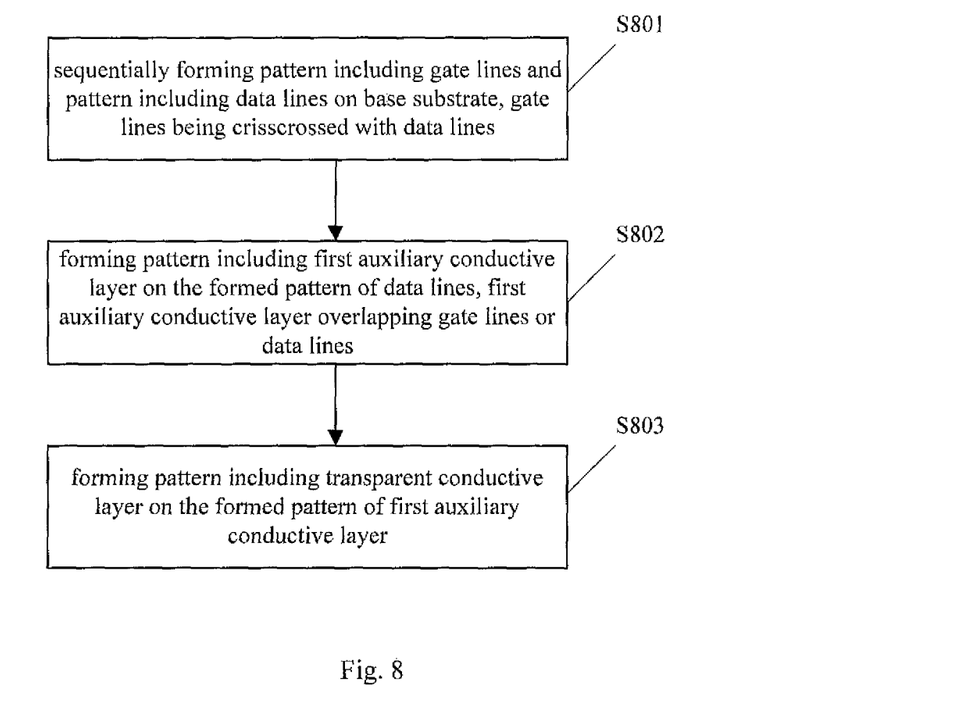
FIG. 8 is a flow chart of a method for manufacturing array substrates according to one embodiment of the present disclosure.

One embodiment of the present disclosure provides a method for manufacturing an array substrate. As shown in FIG. 8, the method for manufacturing the array substrate includes:

Step S801: sequentially forming a pattern including gate lines and a pattern including data lines on a base substrate, the gate lines being crisscrossed with the data lines.

Figure 9A:
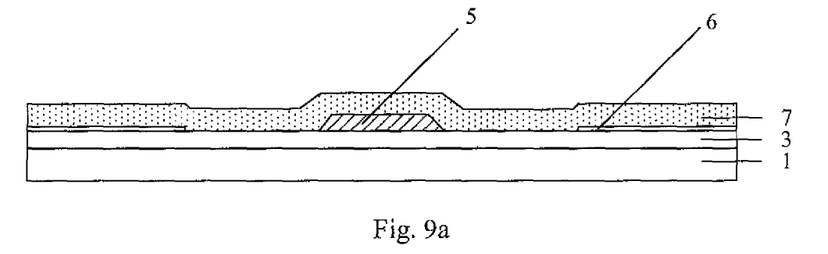
FIGS. 9a-9d are schematic diagrams showing a process of manufacturing an array substrate according to one embodiment of the present disclosure.
Figure 9B:
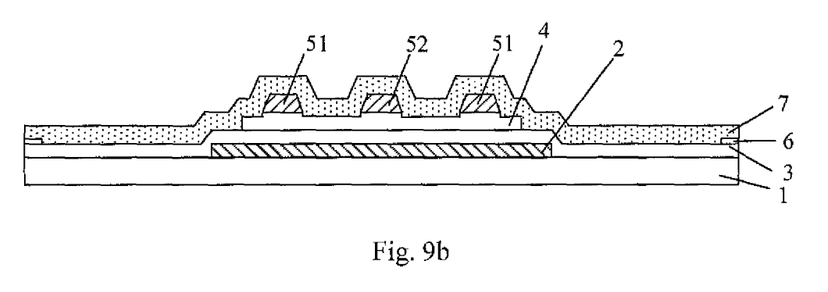

FIGS. 9a-9b show the array substrate after the above step. A specific implementation process can be as follows.

First, forming a layer of gate metal film on the base substrate 1 through sputtering, thermal evaporation, etc. Before forming the gate metal film, a buffer layer may further be formed on the base substrate 1. A layer of photoresist is coated on the gate metal film; a mask plate having a pattern including gate lines 2 and gate electrode 21 is used to cover the photoresist; after exposing, developing and etching, the photoresist is peeled off (removed) to form a pattern including the gate lines 2 and the gate electrodes 21.

Next, forming a gate insulating layer 3 on the pattern including the gate lines 2 and the gate electrodes 21 through a plasma enhanced chemical vapor deposition method, etc.

Then, forming a semiconductor thin film on the gate insulating layer 3 through sputtering, etc.; using a mask plate having a pattern including the active layer 4 to cover the photoresist; after exposing, developing and etching, peeling off the photoresist to form a pattern including the active layer 4.

Subsequently, forming a layer of data line metal film on the active layer 4 through sputtering, thermal evaporation, etc.; coating a layer of photoresist on the data line metal film, and then using a mask plate having a pattern including the data lines 5, the source electrodes 51 and the drain electrodes 52 to cover the photoresist; after exposing, developing and etching, peeling off the photoresist to form a pattern including the data lines 5, the source electrodes 51 and the drain electrodes 52.

Then, forming a layer of transparent conductive film on the pattern including the data lines 5, the source electrodes 51 and the drain electrodes 52 through sputtering, etc., and then using a mask plate having a pattern including pixel electrodes 6 to cover the photoresist; after exposing, developing and etching, peeling off the photoresist to form a pattern including the pixel electrode 6. The pixel electrode 6 is electrically connected with the drain electrodes 52.

Finally, forming a passivation layer 7 on the base substrate 1 on which the pattern including the pixel electrodes 6 is formed through a plasma chemical vapor deposition method, etc.

As shown in FIG. 8, the method for manufacturing array substrates may further include:

Step S802: forming a pattern including a first auxiliary conductive layer on the formed pattern of the data lines, the first auxiliary conductive layer at least partially overlapping the gate lines or the data lines.

Figure 9C:
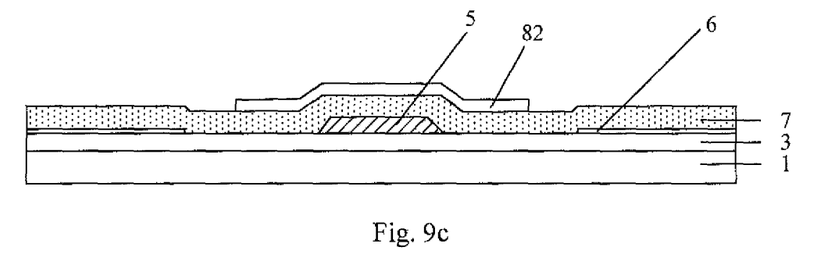
Figure 9D:
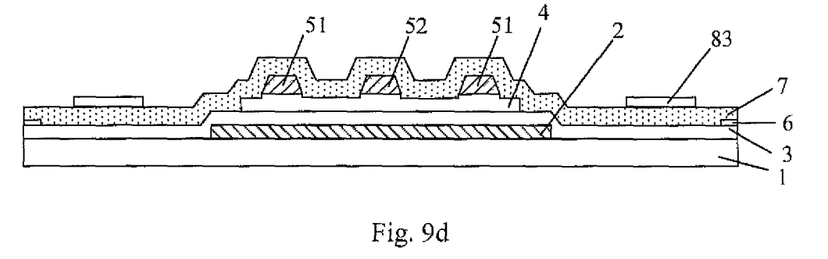

FIGS. 9c-9d show the array substrate after the above step. A specific implementation process can be as follows.

Forming a layer of first conductive film on the formed pattern including the data line lines 5 through sputtering, thermal evaporation, etc.; using a mask plate having a pattern including the first auxiliary conductive layer 81 to cover the photoresist; after steps of exposing, developing and etching, peeling off the photoresist to form a pattern including the first auxiliary conductive layer 81. The first auxiliary conductive layer 81 is optionally made of metallic material with good conductivity such as copper, aluminum, silver, molybdenum, chromium, and so on. A thickness of the first auxiliary conductive layer 81 is optionally 900~4500 Å.

Further, different designs of the pattern of the first auxiliary conductive layer 81 on the mask plate may achieve different relative positions of the first auxiliary conductive layer 81 with respect to the gate lines or the data lines. For example, the first auxiliary conductive layer 81 completely covers the gate lines 2 or the data lines 5; or the first auxiliary conductive layer 81 is located directly above the gate lines 2 or the data lines 5, and an area of an orthographic projection of the first auxiliary conductive layer 81 on the base substrate 1 is smaller than an area of an orthographic projection of the gate lines 2 or the data lines 5 on the base substrate 1; or the first auxiliary conductive layer 81 covers a part of the gate lines 2 or the data lines 5.

In addition, in order to further reduce the resistance of the common electrode 8, a second auxiliary conductive layer 83 may also be formed at the time of forming the pattern including the first auxiliary conductive layer 81 on the formed pattern of the data line lines 5. The second auxiliary conductive layer 83 and the first auxiliary conductive layer 81 are integrally formed. The second auxiliary conductive layer 83 is located between a periphery of thin film transistors on the array substrate and a periphery of pixel electrodes 6. Since the second auxiliary conductive layer 83 and the first auxiliary conductive layer 81 are integrally formed, thus the second auxiliary conductive layer 83 is also optionally made of metallic material with good conductivity, such as copper, aluminum, silver, molybdenum, chromium, and so on. A thickness of the second auxiliary conductive layer 83 is optionally 900~1500 Å.

Step S803: forming a pattern including a transparent conductive layer on the formed pattern of the first auxiliary conductive layer.

A layer of second conductive film may be formed on the formed pattern of first auxiliary conductive layer 81 through sputtering, etc. A mask plate having a pattern including the transparent conductive layer 82 to cover the photoresist; after steps of exposing, developing and etching, the photoresist is peeled off to form a pattern including the transparent conductive layer 82. The array substrate shown in FIGS. 1-3 is finally formed.

Those described above are only embodiments of the present disclosure, but shall not be used to limit the present disclosure. For those skilled in the art, some modifications and alterations may be made without departing from the basic concept and the scope of the present disclosure, and these should fall within the scope of the present disclosure. Thus, the protection scope of the present disclosure should be construed based on the claims.

What is claimed is:

1. An array substrate comprising a base substrate, gate lines and data lines arranged in a crisscross manner on the base substrate, a common electrode, thin film transistors, and pixel electrodes; wherein
the common electrode comprises a transparent conductive layer, a first auxiliary conductive layer under the transparent conductive layer, a second auxiliary conductive layer located between a periphery of the thin film transistors and a periphery of the pixel electrodes;
the first auxiliary conductive layer of the common electrode at least partially overlaps the gate lines or the data lines;
the second auxiliary conductive layer and the first auxiliary conductive layer are integrally formed; and
the transparent conductive layer is located on the second auxiliary conductive layer.

2. The array substrate according to claim 1, wherein
the first auxiliary conductive layer and the second auxiliary conductive layer are made of metal; and
the metal is copper, aluminum, silver, molybdenum, chromium, or any combination thereof.

3. The array substrate according to claim 1, wherein
the first auxiliary conductive layer completely covers the gate lines or the data lines.

4. The array substrate according to claim 1, wherein
the first auxiliary conductive layer is located directly above the gate lines or the data lines; and an area of an orthographic projection of the first auxiliary conductive layer on the base substrate is smaller than an area of an orthographic projection of the gate lines or the data lines on the base substrate.

5. The array substrate according to claim 1, wherein
the first auxiliary conductive layer covers a part of the gate lines or the data lines.

6. The array substrate according to claim 1, wherein
a thickness of each of the first auxiliary conductive layer and the second auxiliary conductive layer is 900~1500 Å; and
a thickness of the transparent conductive layer is 400~700 Å.

7. A display device at least comprising an array substrate, wherein the array substrate comprises a base substrate, gate lines and data lines arranged in a crisscross manner on the base substrate, a common electrode, thin film transistors, and pixel electrodes; wherein
the common electrode comprises a transparent conductive layer, a first auxiliary conductive layer under the transparent conductive layer, a second auxiliary conductive layer located between a periphery of the thin film transistors and a periphery of the pixel electrodes;
the first auxiliary conductive layer of the common electrode at least partially overlaps the gate lines or the data lines;
the second auxiliary conductive layer and the first auxiliary conductive layer are integrally formed; and the transparent conductive layer is located on the second auxiliary conductive layer.

8. The display device according to claim 7, wherein
the first auxiliary conductive layer and the second auxiliary conductive layer are made of metal; and
the metal is copper, aluminum, silver, molybdenum, chromium, or any combination thereof.

9. The display device according to claim 7, wherein
the first auxiliary conductive layer completely covers the gate lines or the data lines.

10. The display device according to claim 7, wherein
the first auxiliary conductive layer is located directly above the gate lines or the data lines; and an area of an orthographic projection of the first auxiliary conductive layer on the base substrate is smaller than an area of an orthographic projection of the gate lines or the data lines on the base substrate.

11. The display device according to claim 7, wherein
the first auxiliary conductive layer covers a part of the gate lines or the data lines.

12. The display device according to claim 7, wherein
a thickness of each of the first auxiliary conductive layer and the second auxiliary conductive layer is 900~1500 Å; and
a thickness of the transparent conductive layer is 400~700 Å.

13. A method for manufacturing an array substrate, comprising:
sequentially forming a pattern including gate lines, a pattern including data lines, thin film transistors, and pixel electrodes on a base substrate, the gate lines and the data lines arranged in a crisscross manner on the base substrate;
forming a pattern including a first auxiliary conductive layer on the formed pattern of the data lines, the first auxiliary conductive layer at least partially overlapping the gate lines or the data lines;
forming a second auxiliary conductive layer at the time of forming the pattern including the first auxiliary conductive layer on the formed pattern of the data line lines, wherein the first auxiliary conductive layer and the second auxiliary conductive layer are integrally formed, the second auxiliary conductive layer is located between a periphery of thin film transistors on the array substrate and a periphery of pixel electrodes; and
forming a pattern including a transparent conductive layer on the formed pattern of the first auxiliary conductive layer and the second auxiliary conductive layer.

14. The method according to claim 13, wherein
the first auxiliary conductive layer and the second auxiliary conductive layer are made of metal; and
the metal is copper, aluminum, silver, molybdenum, chromium, or any combination thereof.

15. The method according to claim 13, wherein the forming a pattern including a first auxiliary conductive layer on the formed pattern of the data lines, the first auxiliary conductive layer at least partially overlapping the gate lines or the data lines comprises:
forming the first auxiliary conductive layer which completely covers the gate lines or the data lines.

16. The method according to claim 13, wherein the forming a pattern including a first auxiliary conductive layer on the formed pattern of the data lines, the first auxiliary conductive layer at least partially overlapping the gate lines or the data lines comprises:
forming the first auxiliary conductive layer which is located directly above the gate lines or the data lines; wherein an area of an orthographic projection of the first auxiliary conductive layer on the base substrate is smaller than an area of an orthographic projection of the gate lines or the data lines on the base substrate.

17. The method according to claim 13, wherein the forming a pattern including a first auxiliary conductive layer on the formed pattern of the data lines, the first auxiliary conductive layer at least partially overlapping the gate lines or the data lines comprises:
forming the first auxiliary conductive layer which covers a part of the gate lines or the data lines.

* * * * *